United States Patent
Fekih-Romdhane et al.

(10) Patent No.: US 7,164,613 B2
(45) Date of Patent: Jan. 16, 2007

(54) FLEXIBLE INTERNAL ADDRESS COUNTING METHOD AND APPARATUS

(75) Inventors: Khaled Fekih-Romdhane, Houston, TX (US); Wolfgang Hokenmaier, Burlington, VT (US); Klaus Hummler, Apex, NC (US)

(73) Assignee: Infineon Technologies AG, Munich (DE)

( * ) Notice: Subject to any disclaimer, the term of this patent is extended or adjusted under 35 U.S.C. 154(b) by 56 days.

(21) Appl. No.: 10/991,434

(22) Filed: Nov. 19, 2004

(65) Prior Publication Data

US 2006/0109735 A1 May 25, 2006

(51) Int. Cl.
 *G11C 7/00* (2006.01)
(52) U.S. Cl. ..................... 365/201; 365/236
(58) Field of Classification Search ............... 365/201, 365/236
 See application file for complete search history.

(56) References Cited

U.S. PATENT DOCUMENTS

| | | | |
|---|---|---|---|
| 4,412,314 A | 10/1983 | Proebsting | |
| 4,618,947 A | 10/1986 | Tran et al. | |
| 4,935,925 A * | 6/1990 | Williams et al. | 370/428 |
| 5,270,982 A | 12/1993 | Watanabe | |
| 5,627,838 A * | 5/1997 | Lin et al. | 714/718 |
| 5,644,530 A * | 7/1997 | Gaultier | 365/185.09 |
| 5,724,540 A | 3/1998 | Kametani | |
| 5,818,848 A * | 10/1998 | Lin et al. | 714/718 |
| 6,078,637 A | 6/2000 | Ansel et al. | |
| 6,304,510 B1 | 10/2001 | Nobunaga et al. | |
| 6,813,741 B1 | 11/2004 | Ansel et al. | |
| 2002/0012286 A1 | 1/2002 | Ernst et al. | |
| 2004/0125686 A1 | 7/2004 | Kim et al. | |
| 2005/0022084 A1* | 1/2005 | Hi et al. | 714/733 |
| 2005/0210179 A1* | 9/2005 | Walmsley et al. | 711/3 |

\* cited by examiner

*Primary Examiner*—Michael Tran
(74) *Attorney, Agent, or Firm*—Edell, Shapiro & Finnan, LLC

(57) ABSTRACT

A method of controlling an internal address counter which provides a count used in accessing a storage cell array to provide increased flexibility in the performance of a test on the array, comprising, rendering a normal overflow condition of the counter modified, thereby enabling alteration of the count provided by the counter in accordance with the requirements of the test being performed on the array.

21 Claims, 2 Drawing Sheets

FLEXIBLE INTERNAL ADDRESS COUNTING METHOD AND APPARATUS

BACKGROUND OF THE INVENTION

The present invention is directed to a method and apparatus for increasing the flexibility of an address counter which is used to generate addresses for accessing an array of storage cells.

Random access memory chips, and in particular dynamic random access memory chips (DRAMs) contain high density storage cells. In the testing of such memory devices, individual cells are tested to locate failing elements and repair them. To address these cells, the tester must generate row and column addresses which are associated with them.

In many automated test processes, internal address counters are used instead of a tester counter to generate test addresses for the rows and columns. In this setting, a logical unit integrated in the DRAM chip generates these addresses internally according to a predetermined pattern.

This scheme is very advantageous from a test time and cost point of view, but it often limits the flexibility of the tester to address DRAM cells. In accordance with normal test procedure, an internal counter is reset at the beginning of the procedure. The counter is incremented in the event of a command to access the next row or column. Each address of the counter is incremented in the event of an overflow of the less significant bits and the command signal being high. Due to the limited communication between the tester and the internal address counter, the test engineer has to implement a workaround to jump to certain array location(s) and perform special test features. One of these workarounds is using dummy commands to increment the counter and then execute the actual command once the address is reached. These workarounds in the nature of dummy commands may cost test time and add to the complexity of the test procedure.

SUMMARY OF THE INVENTION

In accordance with the present invention, a method of controlling an internal address counter which increases flexibility in the performance of a test on a storage cell array is provided which comprises rendering a normal overflow condition of the counter modified, thereby enabling alteration of the count provided by the counter in accordance with the requirements of the test being performed on the array.

BRIEF DESCRIPTION OF DRAWINGS

The invention will be better understood by referring to the accompanying drawings wherein.

DETAILED DESCRIPTION OF PREFERRED EMBODIMENTS

Figure 1:
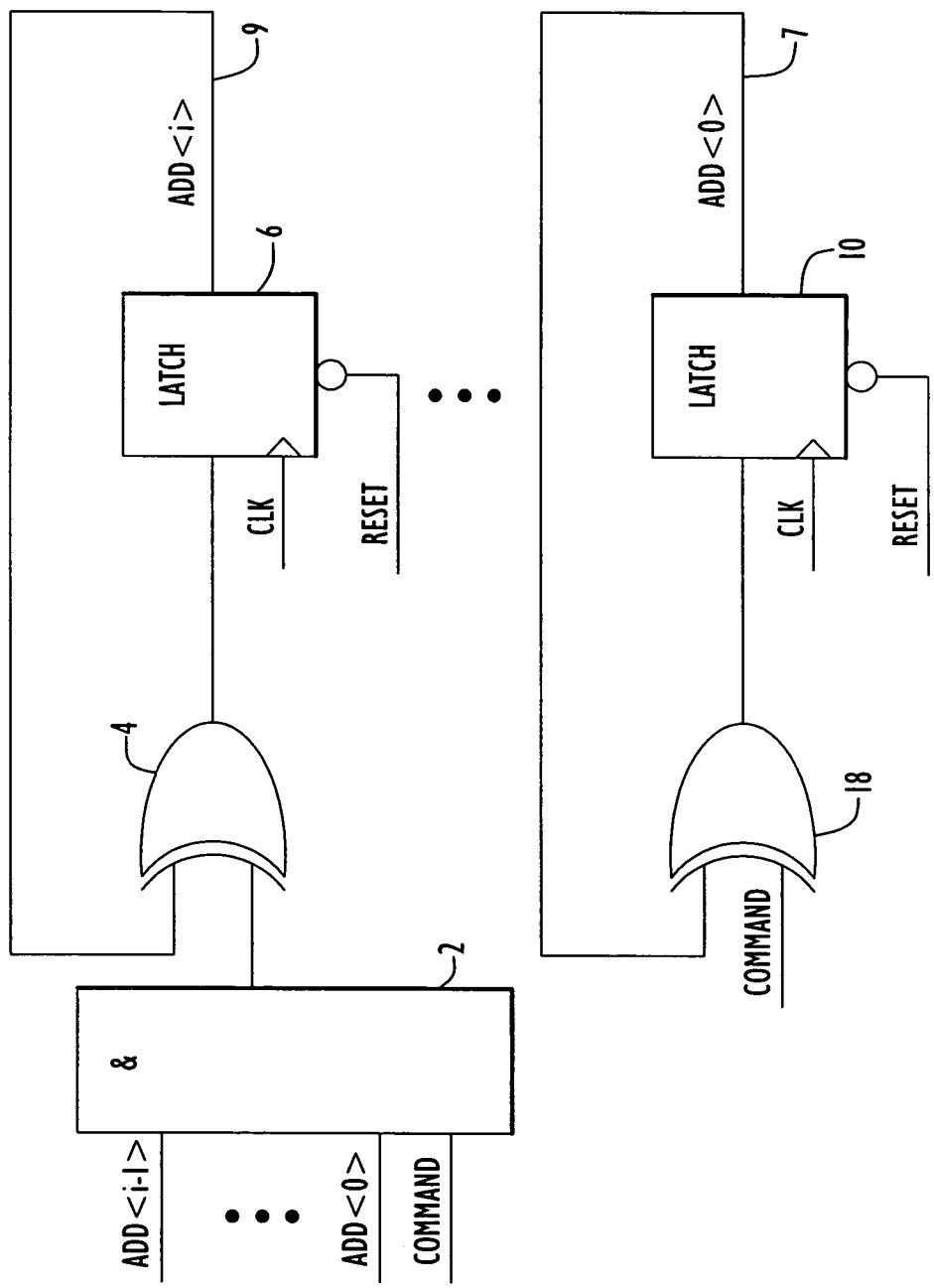
FIG. 1 is a diagram of a prior art internal address counter.

Referring to FIG. 1, an internal address counter of the prior art is shown. The counter counts from ADD <0> to ADD <i> by outputting appropriate binary bits on output lines, including output lines 7 and 9 shown in FIG. 1. Output line 7 is the output line for ADD <0> while output line 9 is the output line for ADD <i>. There are a plurality of output lines between output lines 7 and 9 (not shown) to cover all outputs between ADD <0> and ADD <i>. There are also a plurality of counter stages between ADD <0> and ADD <i> (not shown) which are similar to the counter stage for ADD <i> as will be explained further below. The counter shown is for accessing either the rows or columns of a storage cell array, so another similar counter would also be employed to provide full access to both rows and columns.

After all latches (6, 10, etc.) are reset, the counter counts from ADD <0> to ADD <i> and then starts again at ADD <0> and so forth in normal reiterative manner. The occurrence of each previous count is the trigger for the next count to occur. Referring to FIG. 1, AND gate 2 is seen to have inputs ADD <0> and ADD <i-1>, as well as a command input. When all of the inputs ADD <0> to ADD <i-1> are high and the command input occurs, it is time to move on to ADD <i> by incrementing latch 6, causing line 9, which corresponds to <ADD i> to go high. This is referred to as the normal overflow condition.

It is noted that the output of AND gate 2 is fed to one input of exclusive OR gate 4 and that the output of latch 6 on line 9 is fed back to the other input. In the operation of the circuit, if the output of AND gate 2 goes high and line 9 is low, the output of the exclusive OR gate goes high and latch 6 is incremented when the leading edge of the next clock pulse on the CLK input to latch 6 occurs. On the other hand, if line 9 is high and the output of the AND gate goes high, the output of exclusive OR gate 4 is again low and when the next clock pulse occurs, the latch is incremented so that line 9 goes low.

Although not shown in FIG. 1, the counter actually includes i-1 AND gates similar to AND gate 2. For example, the AND gate which would appear immediately below AND gate 2 in FIG. 1 would have inputs ADD <0> through ADD <i-2> as well as the command input, and so on for the other AND gates.

It is noted that the stage corresponding to ADD <0> does not have an AND gate because there is no bit below ADD <0> to include in an AND function. This stage includes exclusive OR gate 8 and latch 10 which operate as described above. However, in this case the command signal is supplied directly to one input of exclusive OR gate 8.

As discussed above, a disadvantage of the prior art internal counter shown in FIG. 1 is that it is normally already programmed in a predetermined manner for purposes of testing the array. If the tester desires to deviate from the set programming it is necessary to supply dummy commands to the counter to move it to the storage cells which it is desired to test. Since the dummy commands may be time consuming, it is desirable to provide a more flexible internal counter which can be directly programmed by the tester to avoid the necessity for dummy commands.

Figure 2:
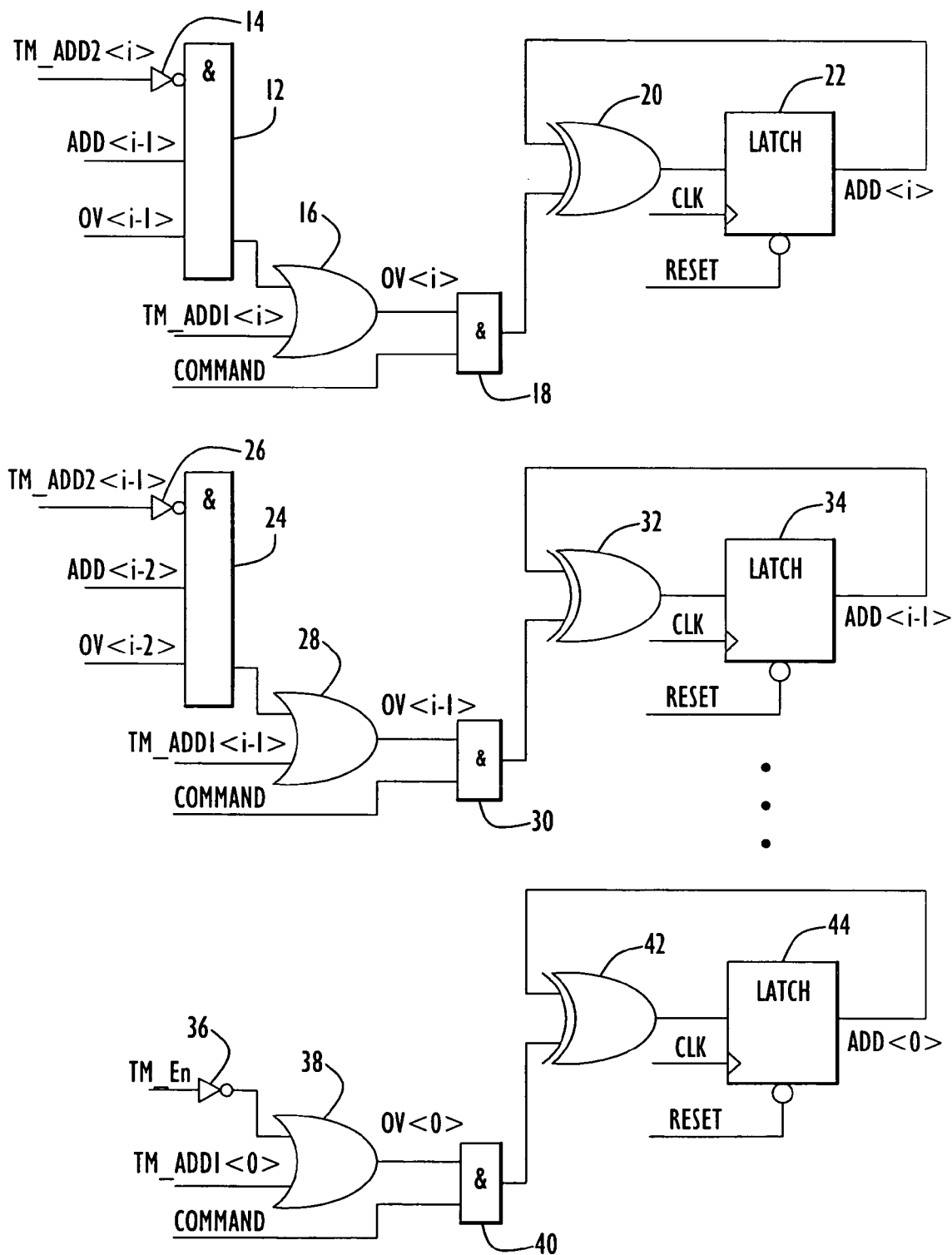
FIG. 2 is a diagram of an embodiment of an internal address counter in accordance with the present invention.

An embodiment of the invention is depicted in FIG. 2. In the configuration of FIG. 2, the normal overflow condition of the counter is rendered modified, thereby enabling alteration of the count in accordance with the requirements of the test being performed. In FIG. 2, only three stages of the counter are shown, ADD <i>, ADD <i-1>, and ADD <0>, as these are representative. In an actual counter, there may be any desired number of bits. By way of non-limitative example, a 14 bit counter may be used.

The embodiment of FIG. 2 includes components which are not present in FIG. 1. Thus, referring to the ADD <i> stage which is representative of all stages corresponding to bits more significant than ADD <0>, it is seen that OR gate 16 and AND gate 18 are present. The command is inputted to AND gate 18, while a test mode bit TM_ADD1<i> is one of the inputs to OR gate 16. Another test mode bit TM_ADD2<i> is inputted to AND gate 12 through an inverter 14. Referring to the ADD <0> stage, OR gate 38 and AND gate 40 are present, and one input to OR gate 38 is a TM_En signal, which is fed through inverter 36, the other input being the test mode bit TM_ADD1<0>. The output circuitry, comprised of exclusive OR gate 20 and latch 22 (ADD<i> stage) is the same as depicted in connection with FIG. 1. It is to be understood that other suitable output circuitry may also be used, for instance by way of non-limitative example.

In the counter shown in FIG. 2, a test mode is used to make the counter more flexible through the setting of the test mode bits TM_ADD 1<i: 0> and TM_ADD2<i: 0>. It is possible to achieve a number of functions with the test mode. By way of example, a start address may be loaded into the counter. As another example, the counter may be caused to count in modulo $2^i$. As a still further example, the counting may be limited to one region of the storage cell array. It is clear that functions such as these increase the flexibility of navigating through the array.

The first function which will be described is loading an offset address into the counter. If the counter is reset and commands are issued, the counter will increment up from 0. If the start address is not the first address, there is an offset that could be reached through dummy commands with the conventional counter. As discussed above, with the counter of FIG. 2 there is no need for dummy commands. Once the counter addresses are reset, a test mode would be used to set the TM_ADD 1<i: 0> inputs to the start address values and TM_EN to active. The next command sequence would set the output addresses to the TM_ADD1 values. The counter is returned to the normal counting sequence when the TM_EN is reset.

In the test mode described above, the normal overflow condition of the counter is overridden by the OR gate function through which the offset address is inserted. However, if the test mode is not used, TM_En is not active and the test mode addresses are reset, therefore the diagrams of FIG. 1 and FIG. 2 are logically equivalent.

It will next be described how the counter can count in modulo $2^i$. For example, if i=2, the counter will address only every fourth storage cell. Whenever the test mode is used, the TM_En input is set. It is noted that there is an inverter 36 between such input and the OR gate 38. Because of the inverter, when TM_EN and TM_ADD1<0> are (is) is set (active) the corresponding input to OR gate 38 is zero. Thus, if TM 1 <0> is not set, which is the case in modulo $2^i$ counting, the counter will not start counting up from zero.

If one of the other TM1 bits is set (e.g. TM ADD <i>, all bits which are less significant than ADD <i> will stay frozen, the ADD <i> will count at each command (OV<i>=1), and the bits which are more significant than ADD <i> will count according to the normal overflow condition. Thus, the counter will count in modulo $2^i$. Such counting can be switched off and the normal counting sequence will follow through the reset of TM_En. Another entry to the modulo $2^i$ would keep ADD <i-1:o> frozen and increment the ADD <n=i>.

It will now be described how a storage cell array region may be addressed with the counting being restricted to that region. This is accomplished by using the test mode bit TM_ADD 2 to freeze the upper bits. Referring to FIG. 2, it is seen that AND gate 12 has inputs OV<i-1>, ADD <i-1>, and TM_ADD2<i>. OV<i-1> denotes "overflow" i-1, in other words that ADD<0> to ADD<i-2> are all high. Therefore the combination of OV<i-1> and ADD <i-1> is the normal overflow condition which will cause i to be incremented (OV<i>). However, it will be noted that TM_ADD2<i> is applied to AND gate 12 through inverter 14. Therefore, if the TM ADD2<i> bit is set the corresponding input to the AND gate will be low and the output of the AND gate will be low. In addition, TM_ADD 1<i> is assumed low. Hence, the ADD <i> bit will not be incremented, and bits which are more significant than ADD <i> will be frozen due to the overflow condition. The result is that access to the memory will be limited to bits below ADD <i>.

The following is an example which utilizes the functions of the counter described above. A memory array of 8K word lines is addressed, wherein the test to be done is to the third quarter array (WL(word lines) WL4K through 6K-1). The counter has to count every fourth address starting with 4K.

First, all addresses are reset by resetting the latches 22, 34, 44, etc. Then, the 4K offset is accomplished by using the test mode to set the TM_ADD 1 inputs of the various stages to the address 4 K and setting TM_EN to active (TM_EN=1) (TM_ADD1<12>=1). The next command will set the ADD to the start address 4K, and the test mode will then reset TM_En as well as the TM_ADD1 bus.

The test mode is then used to enter TM_EN=1, TM_ADD1 <2>=1 and TM_ADD2 <11>=1. The upper two bits will be frozen due to TM_ADD2<11>=1, so it will count from 4K to only 6K−1. Furthermore, it will count in modulo 4 due to TM_ADD1<2>=1. To return to the normal mode, it is only necessary to reset TM_En,TM_ADD1 and TM_ADD2 bits.

There has been disclosed and a flexible internal counting method and apparatus. While the invention has been described in connection with preferred embodiments, variations falling within the spirit of the invention will occur to those skilled in the art. For example, with appropriate correlative inversions, NAND NOR and exclusive NOR gates may be used instead of the AND, OR and exclusive OR gates which are described. It is to be understood that the terms "AND type gate," "OR type gate" and "exclusive OR type gate" as used herein are intended to cover all such gates whether preceded by "N" or not.

It will thus be apparent to one skilled in the art that various changes and modifications can be made without departing from the spirit and scope thereof of the invention. Accordingly, it is intended that the present invention cover such modifications and variations which come within the scope of the appended claims and their equivalents.

What is claimed is:

1. A method of controlling an internal address counter which provides a count used in accessing a storage cell array to provide increased flexibility in the performance of a test on the array, comprising:
rendering a normal overflow condition of the counter by overriding the normal overflow condition, thereby enabling alteration of the count provided by the counter in accordance with the requirements of the test being performed on the array.

2. The method of claim 1 wherein a test mode is used to provide an offset address to the counter when said normal overflow condition is overridden.

3. A method of controlling an internal address counter which provides a count used in accessing a storage cell array to provide increased flexibility in the performance of a test on the array, comprising:
rendering a normal overflow condition of the counter modified by freezing such bits of the counter which are more significant than a selected bit, thereby enabling alteration of the count provided by the counter in accordance with the requirements of the test being performed on the array.

4. The method of claim 3 wherein such bits which are less significant than a selected bit are frozen by inhibiting the least significant bit and inserting a test mode bit at the bit position of said selected bit which is fixed over the duration of the test being performed.

5. A method of controlling an internal address counter which provides a count used in accessing a storage cell array to provide increased flexibility in the performance of a test on the array, comprising:

rendering a normal overflow condition of the counter modified by freezing such bits of the counter which are more significant than a selected bit, thereby enabling alteration of the count provided by the counter in accordance with the requirements of the test performed on the array.

6. The method of claim 5 wherein such bits which are more significant than a selected bit are frozen by inserting a test mode bit at the position of said selected bit which is fixed over the duration of the test being performed while not inhibiting said least significant bit.

7. An apparatus for controlling an internal address counter which provides a count used in accessing a storage cell array to provide increased flexibility in the performance of a test on the array, comprising:

means for rendering a normal overflow condition of the counter inoperative which comprises means for overriding the normal overflow condition, and means for modifying the count provided by the counter in accordance with the requirements of the tests being performed.

8. The apparatus of claim 7 wherein said means for modifying the count provided by the counter includes means for providing an offset address to the counter.

9. An apparatus for controlling an internal address counter which provides a count used in accessing a storage cell array to provide increased flexibility in the performance of a test on the array, comprising:

means for rendering a normal overflow condition of the counter inoperative; and means for modifying the count provided by the counter in accordance with the requirements of the tests being performed, wherein the combination of said means for modifying the count, includes means for freezing such bits of the counter which are less significant than a selected bit.

10. The apparatus of claim 9 wherein said means for freezing such bits of the counter which are less than significant than a selected bit comprises test mode means for inhibiting the least significant bit and for inserting a test mode bit at the bit position of the selected bit which is fixed over the duration of the test being performed.

11. An apparatus for controlling an internal address counter which provides a count used in accessing a storage cell array to provide increased flexibility in the performance of a test on the array, comprising:

means for rendering a normal overflow condition of the counter inoperative; and means for modifying the count provided by the counter in accordance with the requirements of the tests being performed, wherein the combination of said means for a rendering normal overflow condition of the counter inoperative and said means for modifying the count comprises means for freezing such bits of the counter which are more significant than a selected bit.

12. The apparatus of claim 11 wherein said means for freezing such bits of the counter which are more significant than a selected bit comprises test mode means for inserting a test mode bit at the position of said selected bit without inhibiting the least significant bit, over the duration of the test.

13. A method of controlling an internal address counter having a plurality of stages, which provides a count used in accessing a storage cell array to provide increased flexibility in the performance of a test on the array, comprising:

rendering a normal overflow condition of each stage of the counter modified, thereby enabling alteration of the count provided by the counter in accordance with the requirements of the test being performed on the array.

14. An apparatus for controlling an internal address counter having a plurality of stages, which provides a count used in accessing a storage cell array to provide increased flexibility in the performance of a test on the array, comprising:

means for rendering a normal overflow condition of each stage of the counter inoperative; and means for modifying the count provided by the counter in accordance with the requirements of the tests being performed.

15. An internal address counter which is usable in a test mode for providing a count for accessing a storage cell array, comprising:

a plurality of counter stages corresponding to respective bits of the counter, wherein each stage above the stage corresponding to the least significant bit includes;

a) an OR type gate having an output and having a first input which receives a signal indicative of an overflow condition of the bit corresponding to the stage, and a second input for receiving a test mode bit, b) a first AND type gate having an output and having a first input which receives the output of the OR type gate and a second input for receiving a command signal; and c) output circuitry connected to the output of the AND type gate which is capable of changing state.

16. The address counter of claim 15 wherein the signal indicative of the overflow condition is produced by a second AND type gate.

17. The address counter of claim 16 wherein the second AND type gate has an input for receiving a test mode bit.

18. The address counter of claim 15 wherein the counter stage corresponding to the least significant bit includes an OR type gate having an output and having a first input for receiving a test mode enable signal and a second input for receiving a test mode bit.

19. The address counter of claim 18 wherein the counter stage corresponding to the least significant bit further includes an AND type gate having an output and first and second inputs, and also includes output circuitry which is capable of changing state, wherein the output of the OR type gate in such stage is connected to the first input of the AND type gate and the second input of the AND type gate is for receiving a command signal, and wherein the output circuitry is connected to the output of the AND type gate.

20. The address counter of claim 15 wherein the output circuitry comprises a latch and an exclusive OR type gate, wherein the output of the latch is fed back to one input of the exclusive OR type gate, the output of the AND type gate is fed to the other input of the exclusive OR type gate, and the output of the exclusive OR type gate is fed to an input of the latch.

21. The address counter of claim 19 wherein the output circuitry comprises a latch and an exclusive OR type gate, wherein the output of the latch is fed back to one input of the exclusive OR type gate, the output of the AND type gate is fed to the other input or the exclusive OR type gate, and the output of the exclusive OR type gate is fed to an input of the latch.

* * * * *